United States Patent [19]

Adams et al.

[11] Patent Number: 4,792,915
[45] Date of Patent: Dec. 20, 1988

[54] NON LINEAR ADAPTIVE FILTERS

[75] Inventors: Peter F. Adams, Ipswich, England; Mark J. Smith, Edinburgh, Scotland; Robert B. P. Carpenter, Ipswich, England

[73] Assignee: British Telecommunications public limited company, Great Britain

[21] Appl. No.: 861,412

[22] Filed: May 9, 1986

[30] Foreign Application Priority Data

May 10, 1985 [GB] United Kingdom ............... 85 11835

[51] Int. Cl.$^4$ ............................................. G06F 15/31
[52] U.S. Cl. ................................................ 364/724.19
[58] Field of Search ........................................ 364/724

[56] References Cited

U.S. PATENT DOCUMENTS 4,006,352  2/1977  Sato ..................................... 364/724
4,435,823  3/1984  Davis et al. ....................... 364/724 X
4,507,747  3/1985  Houdard et al. .................... 364/724
4,615,038  9/1986  Lim et al. ......................... 364/724 X

FOREIGN PATENT DOCUMENTS 0152172  8/1985  European Pat. Off. .

OTHER PUBLICATIONS

Chang et al., "A Noniterative Method for Identification Using Hammerstein Model", *IEEE Trans. on Automatic Control*, Oct. 1971, pp. 464-468.
Stapleton et al., "Adaptive Noise Cancellation for a Class of Nonlinear, Dynamic Reference Channels", *IEEE Trans. on Ckts. & Systems*, vol. CAS-32, No. 2, Feb. 1985, pp. 143-150.
Agazzi et al., "Nonlinear Echo Cancellation of Data Signals", *IEEE Trans. on Communications*, vol. COM-30, No. 11, Nov. 1982, pp. 2421-2433.
Narendra et al., "An Iterative Method for the Identification of Nonlinear Systems Using a Hammerstein Model", *IEEE Trans. on Automatic Control*, pp. 546-550.

Primary Examiner—David H. Malzahn
Attorney, Agent, or Firm—Nixon & Vanderhye

[57] ABSTRACT

A non-linear adaptive filter is described having a linear filter connected in parallel with a non-linear filter. The linear filter provides fast adaption until it has modelled the linear contribution of each coefficient. Thereafter the non-linear filter continues to adapt until the error signal has been reduced to an acceptable level.

In a preferred embodiment a plurality of unit delay devices provide taps to sub-processing units each of which is arranged to be adapted according to a linear algorithm during an initial part of a training period, and to a non-linear algorithm after said initial part.

The filter has particular use in echo cancellers for data modems.

9 Claims, 5 Drawing Sheets

NON LINEAR ADAPTIVE FILTERS

The present invention relates to non linear adaptive filters of the type in which values are stored in a processing means and are adapted in response to an error signal.

Adaptive filters may be used to reduce the level of noise present in an input signal. Samples of a noise source signal (correlated to the noise present in the input signal) are supplied to a processing circuit to produce a cancellation signal. The cancellation signal is in turn subtractively combined with the input signal to produce an output signal and an error signal. The error signal is supplied to an adaptation circuit which updates the characteristics of the processing circuit to minimise the error signal and maintain the noise in the output signal below an unacceptable level.

Non linear filters are known which are capable of modelling any non linear function. A predetermined number of noise samples are stored by a delay line providing a plurality of tap values. The tap values collectively form the address to a random access memory device (RAM) and the addressed values provide the cancellation signal. Thus if N samples are stored in the shift register and each sample has M bits the total number of storage locations in the RAM is two to the power of the product of N and M. Furthermore in known filters of this type a value stored in the RAM can only be updated by the adaptation circuit when it is actually addressed. It therefore follows that once adaptation is initiated a finite period elapses before the noise in the output signal reaches an acceptable level. The interval between initiating adaptation and the start of satisfactory cancellation is referred to herein as the initial training period.

The problem of slow adaptation in non linear filters is identified in an article by O Agazzi and D Messerschmitt titled "Non Linear Echo Cancellation of Data Signals" published in transactions of the IEEE on communications volume COM 30 No 11 in November 1982. The disclosed system does not provide a general non linear filter but merely provides a linear filter which is modified to model a particular non linear function. A linear filter stores a plurality of tap values, as described above, but each tap value is multiplied by a coefficient to form a product. The cancellation signal is formed by the sum of said products.

Agazzi compensates for non linearities by using extra taps. However as the function being modelled becomes more non linear so the number of taps required increases exponentially. The Agazzi approach therefore has two major disadvantages. Firstly it is only suitable for relatively minor non linearities and, secondly, the nature of the non linearity being modelled must be known.

It is an object of the present invention to reduce the initial training period of a non-linear filter while retaining the filter's ability to model non linear functions.

According to a first aspect of the present invention there is provided a non linear adaptive filter comprising means for receiving samples of a noise source signal, processing means for processing a predetermined number of said samples with values stored in said processing means to produce a cancellation signal, means for combining the cancellation signal with an input signal to produce an error signal, and adaptation means arranged to receive said error signal and adapt said stored values so that said error signal is substantially reduced over an initial training period: characterised in that the adaptation means comprises a first adaptation means for adapting the processing means according to a linear algorithm during a first part of the initial training period and a second adaptation means for adapting the processing means according to a non linear algorithm after said first part of said initial training period.

An advantage of the invention is that the duration of the initial training period is significantly reduced whilst the filter's ability to model non linear functions is retained.

In a preferred embodiment the processing means comprises a linear filter, a separate non linear filter and means for combining the output from each of said filters wherein the first adaptation means adapts said linear filter during the first part of the initial training period and the second adaptation means adapts said non linear filter thereafter. An advantage of this embodiment is that the processor essentially consists of a standard linear filter in parallel with a non linear filter. From a mathematical point of view the system according to the invention may be seen as modelling a Taylor expansion of the non linear function in which the linear filter models the first linear term and the non linear filter models the remaining terms. It therefore follows that the filter will adapt more quickly if the non linear terms of the expansion are relatively small.

In an alternative preferred embodiment the processing means comprises a random access memory device which stores all possible output values to provide a non linear filter wherein coefficients for a linear filter are addressed as part of said memory after the first part of the initial training period. An advantage of this embodiment is that the storage requirements are reduced by storing linear coefficients within the RAM of the non linear filter.

In a second alternative preferred embodiment the processing means comprises a random access memory device which stores all possible output values to provide a non linear filter wherein the first adaptation means adapts a plurality of values according to a linear algorithm during the first part of the initial training period when one value is required to provide a cancellation signal. An advantage of this embodiment is that operation according to the non linear algorithm is essentially the same as standard non linear operation.

Preferably RAM's in all of the preferred embodiments are updated during memory refresh cycles. In a preferred embodiment the processing means comproses a plurality of unit delay devices to provide a tap to each respective sub processing unit wherein each subprocessing unit is adapted according to a linear algorithm during the first part of the initial training period and each subprocessing unit is adapted according to a non-linear algorithm after the initial part of the initial training period. This embodiment is preferably arranged to model a zero memory non linearity followed by linear dispersion as disclosed in European Patent Application No 152 172 of Adams and Cowan. A model for this type of function is also shown in an article by J C Stapleton and S C Bass in an article titled "Adaptive Noise Cancellation for a Class of Nonlinear, Dynamic Reference Channels" published in transactions of the IEEE on circuits and systems VOL CAS 32 of February 1985. However in this system, as shown in FIG. 3, linear coefficients h are formed in addition to the non linear functions f(.) modelled by RAMs. The disclosure is concerned with processing large numbers and requires that only the linear coefficients or the non linear values may be updated during each update cycle. The operation of the filter as a whole is never performed in accordance with a linear algorithm and in some circumstances the implementation of this teaching into a system could result in the initial training period being increased.

Preferably in the present invention the adaptation means operates according to a least mean square algorithm. This provides the advantage of allowing adaptation of the overall filter without splitting the operation into serial sections.

According to a second aspect of the present invention there is provided a method of adapting a non linear filter during an initial training period in which a predetermined number of samples of a noise source signal are processed with values stored in a processor to produce a cancellation signal: characterised in that the processing means is adapted according to a linear algorithm during a first part of the intitial training period and the processing means is adapted according to a non linear algorithm after said first part.

The filter is particularly suitable for use in an echo canceller.

According to a third aspect of the present invention there is provided an echo canceller in which received data includes noise due to transmitted data, comprising a digital filter arranged to receive samples of a noise source signal indicative of the transmitted signal to produce a cancellation signal, wherein the characteristics of the filter are adapted in response to an error signal: characterised in that the digital filter includes means for adapting said characteristics according to a linear algorithm during a first part of an initial training period and thereafter according to a non linear algorithm.

The invention will now be described by way of example only with reference to the accompanying drawings of which FIG. 1 shows a non linear filter in which the output from a transversal linear filter is combined with the output from a look-up table filter.

Figure 1:
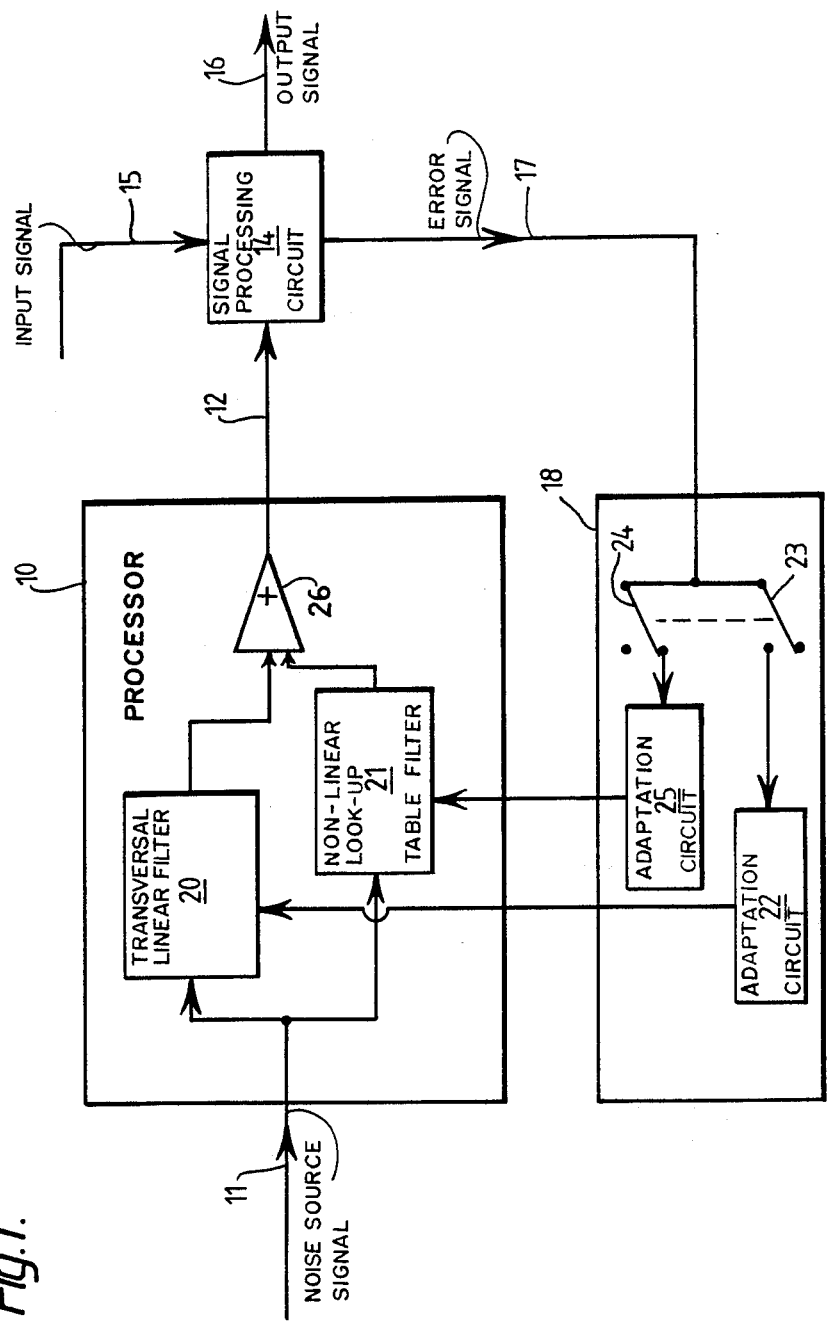

A non linear filter incorporating the present invention is shown in FIG. 1. A processor 10 receives a noise source signal on a line 11 wherein samples of the noise source signal are stored to produce a cancellation signal on a line 12. A circuit 14 subtracts the cancellation signal from an input signal on a line 15 to produce an output on a line 16 and an error signal on a line 17. The error signal is supplied to an adaptation circuit 18 which adapts values stored in the processor 10.

The processor 10 comprises a transversal linear filter 20 and a non linear look-up table filter 21 each having N taps. The output from filter 20 is combined with the output from filter 21 by a summation circuit 26 to produce the cancellation signal on line 12.

Figure 2A:
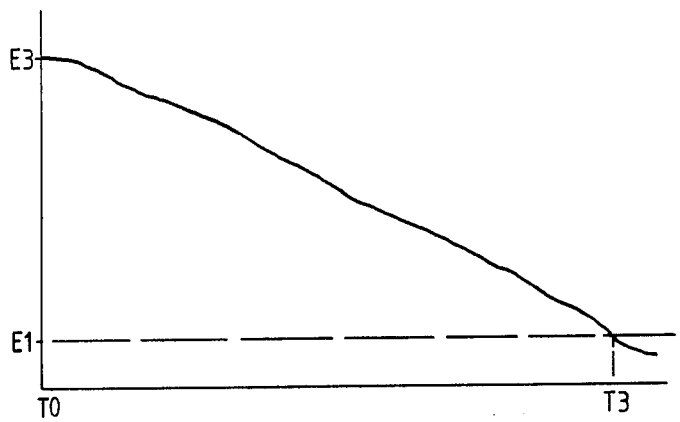
FIG. 2A shows the error response of a look up table filter over its initial training period when modelling a non linear function.
Figure 2B:
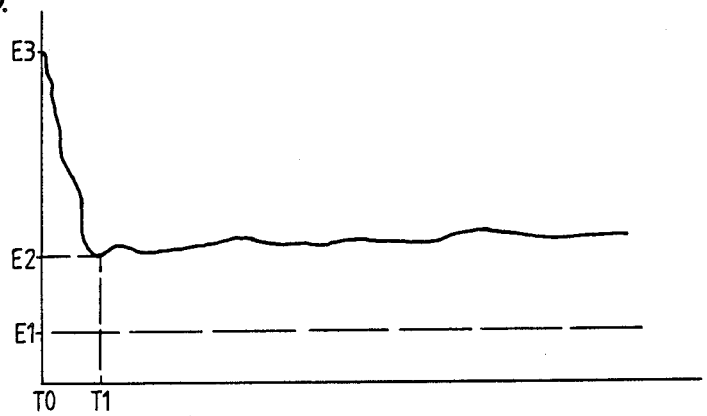
FIG. 2B shows the error response of a linear filter over its initial training period with the same time scale as FIG. 2A and while modelling a similar non linear function.
Figure 2C:
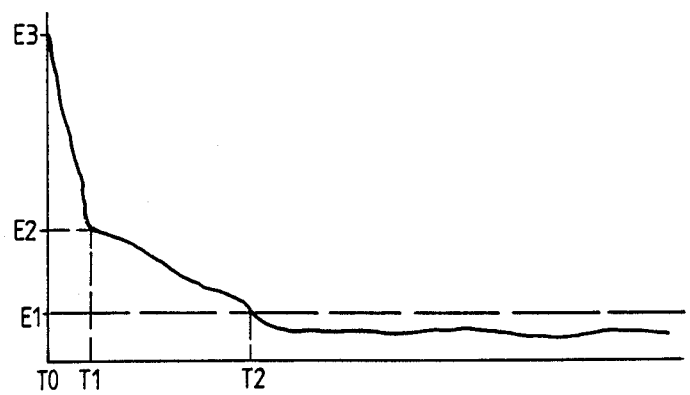
FIG. 2C shows the error response of the filter shown in FIG. 1 under similar circumstances to FIGS. 2A and 2B.

FIG. 2 shows three plots, 2A, 2B and 2C, of an error signal against time over an initial training period. In 2A the processor 10 is assumed to consist solely of the non linear filter 21 and at time T3 the error signal reaches an acceptable value E1. In 2B the processor 10 is assumed to consist solely of the linear filter 20 and the error signal starts at the same unacceptable level E3 but quickly reaches a value of E2 at time T1. However the error signal levels out at this value and never reaches E1. 2C shows the error response of the combined filters of FIG. 1.

During a first part of the initial training period the linear filter 20 is adapted by a first circuit 22 in the adaptation circuit 18. Circuit 22 receives the error signal via a switch 23 which is ganged with a similar switch 24. At time T1 switch 23 is opened and switch 24 is closed thus supplying the error signal to a second circuit 25, in the adaptation circuit, which adapts the non linear filter 21. After the first part of the intitial training period the coefficients in the linear filter 20 are not adapted but filter 20 continues to provide an output which is combined with a updated non linear contribution from the non linear filter 21.

Figure 3:
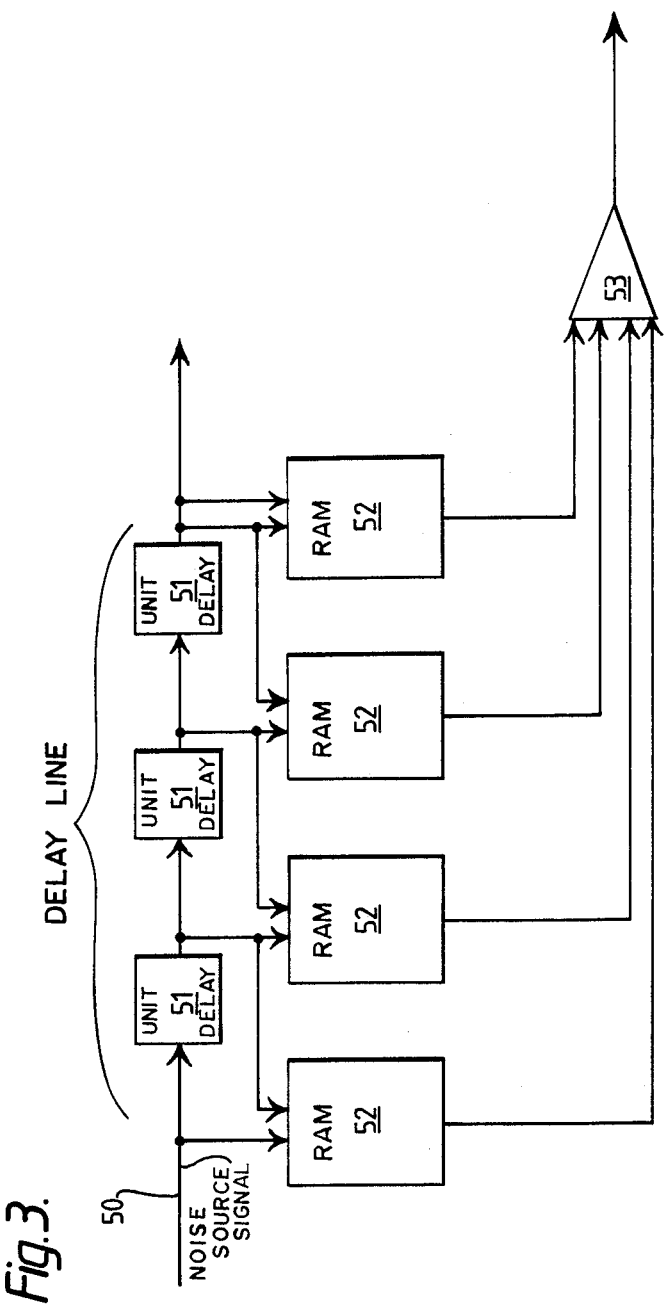
FIG. 3 shows a preferred filter disclosed in European Patent Application No 152 172.

Fast adapting non-linear filters according to the present invention may be used in echo cancellers and in particular in echo cancellers for data modems. An echo canceller of this type is described in the above mentioned European patent Application. A preferred non-linear filter for this application is shown in FIG. 3. A noise source signal on a line 50 consisting of N bits is supplied to a delay line having a plurality of unit delays 51. The noise source signal and the output from each subsequent delay provide address taps for RAMS 52. The structure shown is equivalent to a model consisting of a linear dispersion, followed by a memory-less non-linearity, followed by a linear dispersion. If T taps provide an address for a RAM 52 then the number of values stored in each RAM is given by two to the power of the product of N and T. During adaptation according to a non-linear algorithm only one of these values is updated during each adaptation cycle resulting in a relatively long training period.

Figure 4:
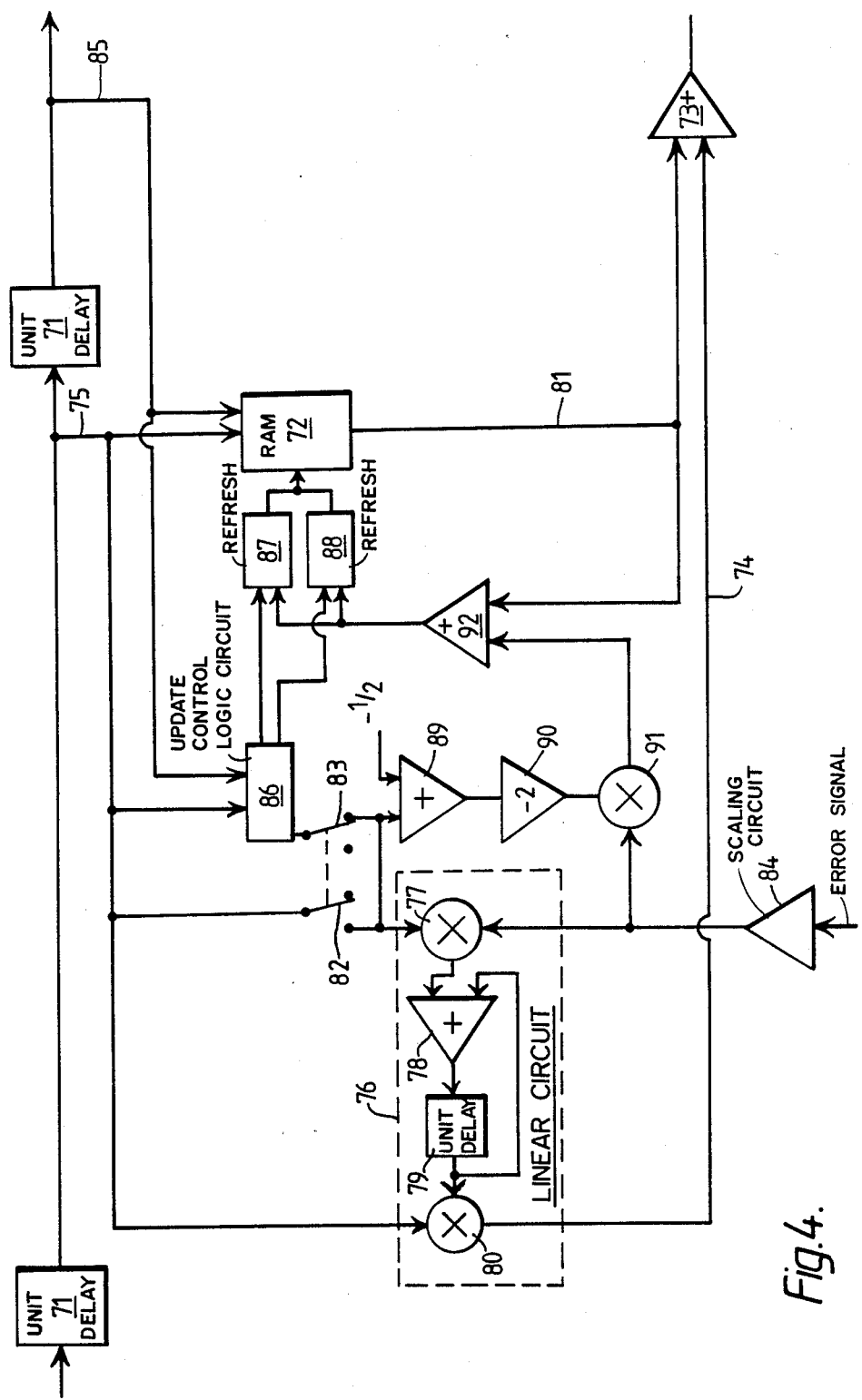
FIG. 4 shows a filter based on the structure of the filter shown in FIG. 3 embodying the present invention.

A preferred embodiment according to the present invention is shown in FIG. 4. Unit delays 71 are similar to unit delays 51. A RAM 72 requires one less storage location than RAM 52 and a summation circuit 73 is similar to circuit 53. During the first part of the initial training period an output contribution is generated on a line 74 by processing a first input tap on a line 75 in a linear circuit 76. The filter therefore operates as a transversal linear filter in which circuit 76 consists of a multiplier 77, a summation circuit 78, a unit delay 79 and a second multiplier 80.

The values stored in the RAM 72 are all zero during the first part of the initial training period thus during said first part there is no output from RAM 72 on line 81. A switch 82 is closed and a switch 83 is open. The linear circuit 76 receives the error signal via a scaling circuit 84 which is supplied to the multiplier 77.

During the secondary part of the initial training period the filter of FIG. 4 adapts according to a non-linear algorithm and RAM 72 is addressed by a plurality of taps—a second tap 85 is shown in FIG. 4. Switch 82 is now open and switch 83 is closed, as shown in the figure. Taps 75 and 85 are supplied to a logic circuit 86 which produces an output of one for one and only one of the possible two to the power of the product of N and T tap values—in this embodiment T equals two. For all other tap values the output from logic circuit 86 is zero.

To ensure a smooth transition from the first part of the initial training period to the secondary part of said initial training period the linear circuit continues to operate during said second part. It is adapted to store one particular contribution which is identified by the logic circuit 86. For all other contributions the linear coefficient is also employed but is then combined with a value stored in the RAM 72. When any of the contributions requiring a value stored in the RAM 72 are used then only that particular value in the RAM is adapted: this is achieved by a first memory refresh circuit 87. However when the linear coefficient is used alone it is then adapted and all the values stores in the RAM 72 must also be adapted by a value equal to the inverse of the change in the value stored in circuit 76. This is achieved by a second RAM refresh circuit 88. The RAM 72 employs dynamic memory which must be refreshed, therefore, changing values during a refresh cycle (as performed by circuit 88) is not substantially more difficult than performing a normal refresh. During each adaptation cycle the required refresh circuit (87 or 88) is enabled by the logic circuit 86.

When the output from the logic circuit 86 is zero the first refresh circuit 87 is enabled and a zero is supplied to multiplier 77 thus effectively disabling the linear coefficient circuit 76. Minue one half is subtracted from the zero, from circuit 86, by a subtraction circuit 89 to give an output of minus one half. This output is then multiplied by minus 2 by a gain circuit 90 to produce an output of plus one to a multiplier 91. Multiplier 91 also receives the error signal from circuit 84 which, uneffected by being multiplied by plus one, is supplied to a summation circuit 92 where it is added to the output from the RAM 72 on line 81. The output from the summation circuit 92 is then supplied to refresh circuit 87.

When the output from the logic circuit is one then circuit 76 is enabled while the combination of circuits 89 and 90 produce a minus one which is multiplied by the error signal. If, therefore, circuit 76 is adapted in the positive sense than all the values in RAM 72 are adapted by an equal measure in the negative sense.

Figure 5:
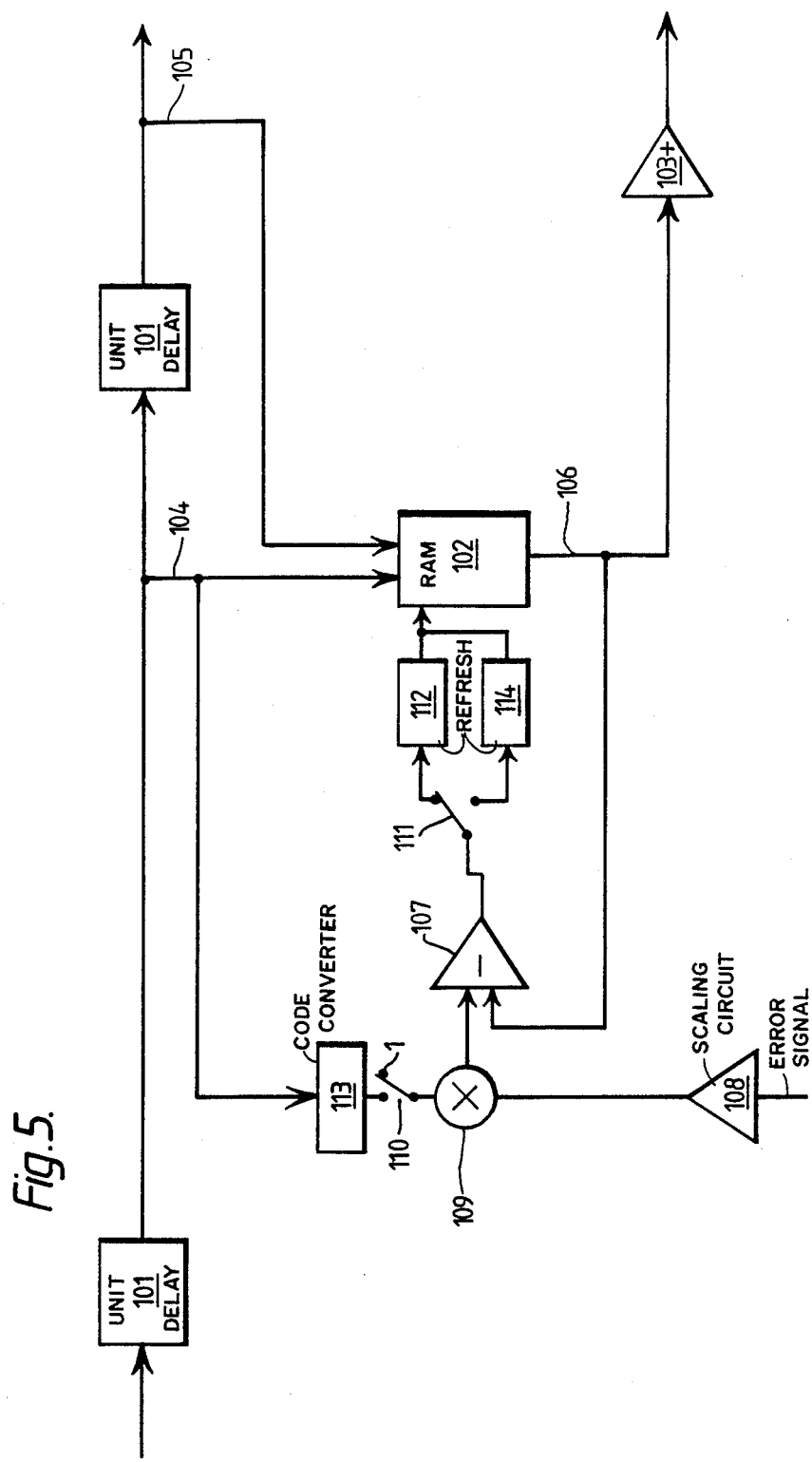
FIG. 5 shows an alternative filter to that shown in FIG. 4.

An alternative modification to the filter of FIG. 3 incorporating the present invention is shown in FIG. 5. Unit delays 101, RAM 102 and summation circuit 103 are similar to devices 51, 52 and 53 in FIG. 3. However each RAM 102 is adapted according to a linear algorithm during a first part of the initial training period, and is then adapted according to a non-linear algorithm after said first part of the initial training period.

Operation of the circuit shown in FIG. 5 according to a non-linear algorithm is substantially the same as in the standard look up table algorithm. The RAM 102 is addressed by tap values on lines 104 and 105 to produce an output contribution on a line 106. The output contribution is subtractively combined with an error signal by a subtraction circuit 107. The error signal is supplied to circuit 107 via a scaling circuit 108 and a multiplier 109. The multiplier receives a second input, via a switch 110, which is permanently set to one after the first part of the initial training period. A second switch 111 connects the output of the subtraction circuit 107 to a memory refresh circuit 112 which updates the value stored therein which produced a cancellation contribution.

During the first part of the initial training period switches 110 and 111 are in their alternative position to that shown in FIG. 5. Tap 104 is connected to a code converter 113 which converts the numerical code to binary values representing the actual analogue levels which are being modelled. The output from the code converter is then supplied to multiplier 109. The resulting product is supplied to summation circuit 107 which receives the output from RAM 102 to generate an adaptation value for the adaptation cycle. The adaptation value is then supplied to a RAM refresh circuit 114 via switch 111. The refresh circuit 114 updates each value stored in the RAM 102 in response to the adaptation value so that the values stored in the RAM 102 are linearly related. The adaptation value is therefore suitably scaled for each value stored in the RAM 102.

The circuits described herein are suitable for implementation as integrated circuits.

We claim:

1. A non linear adaptive filter comprising:
   means for a receiving samples of a noise source signal,
   processing means for processing a predetermined number of said samples with values stored in said processing means to produce a cancellation signal,
   means for combining the cancellation signal with an input signal to produce an error signal, and
   adaptation means arranged to receive said error signal and adapt said stored values so that said error signal is substantially reduced over an initial training period wherein the adaptation means includes
   a first adaptation means for adapting the processing means to cancel noise according to a linear algorithm
   a second adaptation means for adapting the processing means to cancel noise according to a non linear algorithm, and
   switching means arranged to select said first adaptation means for a first part of said initial training period, said switching means selecting said second adaptation means after said first part of said initial training period.

2. A non linear filter according to claim 1 wherein:
   the processing means comprises a linear filter, a separate non linear filter and means for combining the output from each of said filters, and
   the first adaptation means being selected to adapt said linear filter during the first part of the initial training period and the second adaptation means being selected to adapt said non linear filter thereafter.

3. A non linear filter according to claim 1 wherein the processing means comprises:
   a random access memory device which stores all possible output values to provide a non linear filter and
   addressing means which addresses said memory to cause output of value including coefficients of the linear filter after the first part of the initial training period.

4. A non linear filter according to claim 1 wherein the processing means comprises:
   a random access memory device which stores all possible output values to provide a non linear filter,
   the first adaptation means causing a plurality of values stored in said memory device to adapt according to a linear algorithm during the first part of the initial training period.

5. A non linear filter according to claim 1 wherein the processing means comprises:
a plurality of unit delay devices to provide a tap to each of a respective sub processing unit and each sub processing unit is adapted according to linear algorithm during the first part of the initial training period and each subprocessing unit is adapted according to a non-linear algorithm after the initial part of the initial training period.

6. A method of adapting a non linear filter during an initial training period in which a predetermined number of samples of a noise source signal are processed with values stored in a processor to produce a cancellation signal;
the processor adapting the cancellation signal value according to a linear algorithm during a first part of the initial training period and adapting the cancellation signal value according to a non linear algorithm after said first part of the initial training period.

7. An echo canceller in which received data includes noise due to transmitted data, the echo canceller comprising:
a digital filter arranged to receive samples of a noise source signal derived from the transmitted signal to produce a cancellation signal in which characteristics of the filter are adapted in response to means for generating an error signal derived from said noise source signal,
the digital filter including first means for adapting said characteristics according to a linear algorithm during a first part of an initial training period and second means for adapting said characteristics according to a non linear algorithm and switching means arranged to cause selection of said first means for said first part of said initial training period and to cause selection of said second means thereafter.

8. A non-linear adaptive signal filter having a reduced training period and comprising:
linear adaptive filter means for adaptively cancelling noise components from an input signal in accordance with a linear algorithm:
non-linear adaptive filter means for adaptively cancelling noise components from said input signal in accordance with a non-linear algorithm;
switch means coupled to both said filter means (a) for initially utilizing said linear adaptive filter means during a first time period T1 during which said linear adaptive filter means adaptively generates an error cancellation signal which has a value E at the end of period T1, and (b) for subsequently utilizing said non-linear adaptive filter means after period T1 while continuing also to use the final cancellation signal value E provided by the linear adaptive filter means in combination with the output of the non-linear adaptive filter means to cancel noise components from the input signal.

9. A method for decreasing the effective training period of a non-linear adaptive signal filter, said method comprising:
adaptively cancelling noise components from an input signal initially during said training period in accordance with a linear algorithm during a first time period T1 during which a linear adaptive filter means adaptively generates an error cancellation signal which has a value E at the end of period T1, and
thereafter during said training period adaptively cancelling noise components from said input signal in accordance with a non-linear algorithm utilizing a non-linear adaptive filter means after period T1 while continuing also to use the final cancellation signal value E provided by the linear adaptive filter means in combination with the output of the non-linear adaptive filter means to cancel noise components from the input signal.

* * * * *